(12) United States Patent
Trawick et al.

(10) Patent No.: US 11,394,152 B2
(45) Date of Patent: Jul. 19, 2022

(54) ELECTRICAL CONNECTOR SPACER SYSTEM

(71) Applicant: Rolls-Royce Corporation, Indianapolis, IN (US)

(72) Inventors: David Russell Trawick, Indianapolis, IN (US); Daniel Lawrence Phelps, Fishers, IN (US)

(73) Assignee: ROLLS-ROYCE CORPORATION, Indianapolis, IN (US)

( * ) Notice: Subject to any disclaimer, the term of this patent is extended or adjusted under 35 U.S.C. 154(b) by 315 days.

(21) Appl. No.: 16/811,887

(22) Filed: Mar. 6, 2020

(65) Prior Publication Data
US 2021/0281004 A1  Sep. 9, 2021

(51) Int. Cl.
| | | |
|---|---|---|
| *H01R 13/443* | (2006.01) | |
| *H01R 13/53* | (2006.01) | |
| *H01R 13/05* | (2006.01) | |

(52) U.S. Cl.
CPC ......... *H01R 13/443* (2013.01); *H01R 13/052* (2013.01); *H01R 13/53* (2013.01); *H01R 2201/26* (2013.01)

(58) Field of Classification Search
CPC .............. H01R 2201/26; H01R 13/443; H01R 13/052; H01R 13/53
USPC ......................................... 439/148, 149, 528
See application file for complete search history.

(56) References Cited

U.S. PATENT DOCUMENTS

| | | | |
|---|---|---|---|
| 2,860,316 A | | 11/1958 | Watters et al. |
| 3,004,170 A | * | 10/1961 | Greenspan .............. B60R 25/04 439/43 |
| 3,506,949 A | | 4/1970 | Venaleck et al. |
| 3,842,393 A | * | 10/1974 | Glover ................... H01R 13/53 439/281 |
| 3,915,476 A | | 10/1975 | Burkle |
| 4,740,169 A | * | 4/1988 | Gordon .............. H01R 13/5213 439/148 |
| 4,749,362 A | | 6/1988 | Hoffman et al. |
| 4,840,547 A | * | 6/1989 | Fry ........................ F04B 39/121 439/892 |

(Continued)

FOREIGN PATENT DOCUMENTS

| | | |
|---|---|---|
| CN | 202676841 U | 1/2013 |
| CN | 103972857 A | 8/2014 |

(Continued)

*Primary Examiner* — Marcus E Harcum
(74) *Attorney, Agent, or Firm* — Crowell & Moring LLP

(57) ABSTRACT

A power connector spacer system includes a non-conducting body for insertion into a receptacle of a male power connector in place of a corresponding female power connector. The body may include a latch dimensioned and configured to detachable couple with an interior surface of the receptacle of the male power connector. The body may also include a flange dimensioned to abut a rim of the receptacle, and non-conducting passageways extending through the body from the proximate end to a distal end. Each of the passageways may be dimensioned to receive and isolate one of a plurality of power pins included in the receptacle of the male power connector, and a respective end of each of the power pins may be disposed in respective passageways away from the distal end of the body for isolated detection of high voltage electric power by contact with a meter probe in respective the passageways.

15 Claims, 4 Drawing Sheets

(56) References Cited

U.S. PATENT DOCUMENTS

| | | | | |
|---|---|---|---|---|
| 5,009,610 A * | 4/1991 | Woskow | H01R 13/443 | 174/67 |
| 5,017,148 A * | 5/1991 | Buckshaw | H01R 13/443 | 439/135 |
| 5,440,235 A * | 8/1995 | Oko | H01R 13/5213 | 439/135 |
| 5,626,486 A * | 5/1997 | Shelly | H01R 13/53 | 439/273 |
| 5,947,755 A * | 9/1999 | Conway | H01R 13/447 | 439/148 |
| 6,171,140 B1 * | 1/2001 | Anbo | H01R 13/7032 | 439/516 |
| 6,309,246 B1 * | 10/2001 | Keaton | H01R 13/447 | 333/125 |
| 6,814,627 B2 * | 11/2004 | Yamamoto | H01R 13/447 | 439/701 |
| 7,775,814 B1 * | 8/2010 | Bhutani | H01R 13/447 | 439/146 |
| 8,382,499 B2 * | 2/2013 | Oketani | H01R 13/62933 | 439/150 |
| 8,545,275 B2 | 10/2013 | Wang et al. | | |
| 10,027,072 B1 | 7/2018 | Shaeffer et al. | | |
| 10,348,020 B2 | 7/2019 | Zhu et al. | | |
| 2003/0077930 A1 * | 4/2003 | Chu | H01R 13/4538 | 439/140 |
| 2007/0190855 A1 * | 8/2007 | Meister | H01R 13/443 | 439/595 |
| 2007/0232148 A1 * | 10/2007 | Aime | H01R 13/443 | 439/660 |
| 2010/0009561 A1 * | 1/2010 | Wu | H01R 13/5213 | 439/136 |
| 2010/0184313 A1 * | 7/2010 | Morrison | H01R 13/5213 | 439/148 |
| 2012/0094511 A1 * | 4/2012 | Sil | H01R 24/78 | 439/535 |
| 2012/0231644 A1 | 9/2012 | Kinoshita | | |
| 2014/0211353 A1 | 7/2014 | Lai | | |
| 2014/0213082 A1 * | 7/2014 | Zhou | H01R 13/443 | 439/149 |
| 2017/0187135 A1 * | 6/2017 | Azoulay | H01R 13/717 | |

FOREIGN PATENT DOCUMENTS

| | | | | |
|---|---|---|---|---|
| CN | 204103198 U | | 1/2015 | |
| DE | 202017101060 U1 * | | 7/2018 | H01R 13/42 |
| EP | 60644 A * | | 9/1982 | H01R 13/443 |
| KR | 20170048670 A * | | 5/2017 | |

* cited by examiner

ELECTRICAL CONNECTOR SPACER SYSTEM

TECHNICAL FIELD

This disclosure relates to testing power connectors and, more specifically, to an electrical connector spacer system for meter measurement of pinned power connectors.

BACKGROUND

Power networks include conductors to provide a conductive path for voltage and current in circuits and equipment included in such power networks. Vehicles such as aircraft may include power networks. Safety related work practices should be employed to prevent electric shock or other injuries caused by direct or indirect contact when work is performed on or near equipment or circuits operating at or above 50 volts. Prior to commencing work, live parts of such circuits or equipment to which a worker is exposed should be deenergized by disconnection from all electric energy sources. Testing along with locking and/or tagout procedures may be used to ensure such live parts are disconnected and deenergized. Electric equipment and circuits may be electrically connected using two piece power connectors.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

A power connector spacer system for testing for an energized power circuit includes a power conductor spacer for meter measurement of pinned power connectors. The system may be used by detaching a coupler of a male power connector from corresponding coupler of a corresponding female power connector, and withdrawing the female power connector from a receptacle of the male power connector to expose a plurality of power pins fixedly extending into the receptacle from a base of the male power connector. The non-conducting power connector spacer may be inserted into the receptacle of the male power connector in place of the corresponding female power connector by aligning a plurality of passageways formed in the power connector spacer with respective power pins extending from the base of the male power connector.

An insertable portion of a body of the power connector spacer may be inserted into the receptacle of the male power connector such that each of the respective power pins enters a proximate end of power connector spacer and extends through only a portion of a respective separate one of the passageways. Upon insertion, a latch included on the body of the power connector spacer may detachably couple with an interior surface of the receptacle that is other than the coupler such that the proximate end of the body is adjacent the base. A meter probe may be inserted into each of the passageways at a distal end of the power connector spacer to electrically contact and measure a voltage of each of the respective power pins residing in the passageways in isolation from each other.

One interesting feature of the systems and methods described below may be that the meter probe must be inserted into a respective passageway in the power connector spacer in order to electrically contact the respective power pins. This creates a tactile confirmation of electrical connection for the user, and containment of the meter probe within the walls of the passageway to avoid inadvertent contact with any other conductive material. Alternatively, or in addition, an interesting feature of the systems and methods described below may be that the body of the power connector spacer provides a relatively high conductivity path to ground, which does not create a hazardous discharge, but does shunt charge potential to ground.

Figure 1:
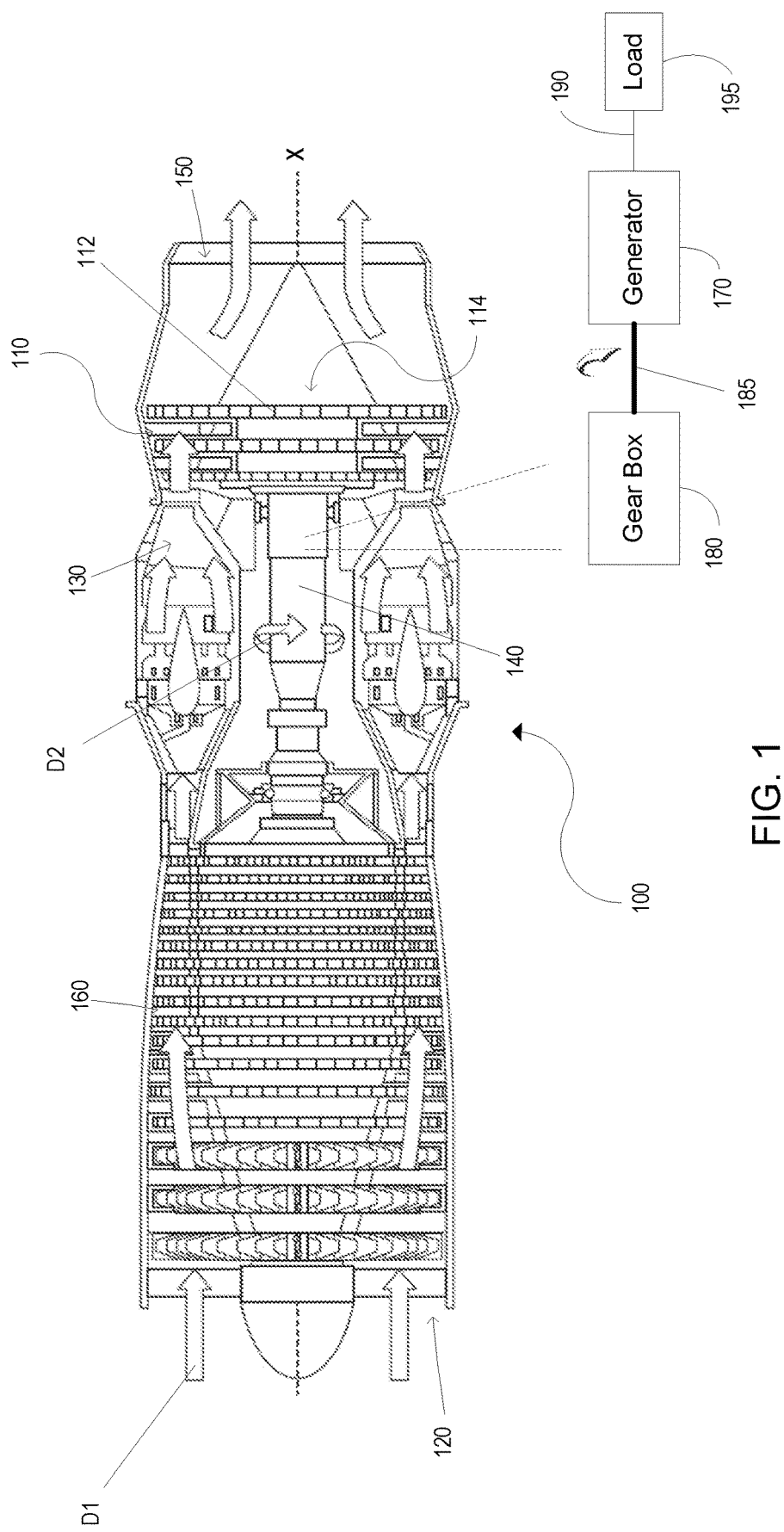
FIG. 1 illustrates a cross-sectional view of an example of a gas turbine engine and an example gearbox and generator supply load.

FIG. 1 is a cross-sectional view of a gas turbine engine 100. In some examples, the gas turbine engine 100 may supply power to and/or provide propulsion of a vehicle such as an aircraft, ship, car, truck or other form of conveyance. Examples of an aircraft may include a helicopter, an airplane, an unmanned space vehicle, a fixed wing vehicle, a variable wing vehicle, a rotary wing vehicle, an unmanned combat aerial vehicle, a tailless aircraft, a hover craft, and any other airborne and/or extraterrestrial (spacecraft) vehicle. Alternatively or in addition, the gas turbine engine 100 may be utilized in a configuration unrelated to a vehicle or an aircraft such as, for example, an industrial application, an energy application, a power plant, a pumping set, a marine application, a weapon system, a security system, a perimeter defense or security system.

The gas turbine engine 100 may take a variety of forms in various embodiments. Though depicted as an axial flow engine, in some forms the gas turbine engine 100 may have multiple spools and/or may be a centrifugal or mixed centrifugal/axial flow engine. In some forms, the gas turbine engine 100 may be a turboprop, a turbofan, or a turboshaft engine. Furthermore, the gas turbine engine 100 may be an adaptive cycle and/or variable cycle engine. Other variations are also contemplated.

The gas turbine engine 100 may include an intake section 120, a compressor section 160, a combustion section 130, a turbine section 110, and an exhaust section 150. During operation of the gas turbine engine 100, fluid received from the intake section 120, such as air, travels along the direction D1 and may be compressed within the compressor section 160. The compressed fluid may then be mixed with fuel and the mixture may be burned in the combustion section 130. The combustion section 130 may include any suitable fuel injection and combustion mechanisms. The hot, high pressure fluid may then pass through the turbine section 110 to extract energy from the fluid and cause a turbine shaft of a turbine 114 in the turbine section 110 to rotate, which in turn drives the compressor section 160. Discharge fluid may exit the exhaust section 150.

As noted above, the hot, high pressure fluid passes through the turbine section 110 during operation of the gas turbine engine 100. As the fluid flows through the turbine section 110, the fluid passes between adjacent blades 112 of the turbine 114 causing the turbine 114 to rotate. The rotating turbine 114 may turn a shaft 140 in a rotational direction D2, for example. The blades 112 may rotate around an axis of rotation, which may correspond to a centerline X of the turbine 114 in some examples.

In applications, the gas turbine engine 100 may operate as a prime mover to drive a generator 170 in a hybrid or electric vehicle. For example, the shaft 140 may be rotatably coupled with a gearbox 180, which may be rotatably coupled with the generator 170 via gearbox shaft 185. In other examples, the gearbox 180 may be omitted and the generator 170 may be direct coupled, or otherwise coupled with the shaft 180 so as to be rotatably driven by the gas turbine engine 100 to produce electric power. The gearbox 180 may include any device that performs speed and/or torque conversions from a rotating power source to another device. Examples of the gearbox 180 may include gears, a gear train, a transmission, or any other type of device that performs rotational speed and/or torque conversions. The generator 170 may include any type of electrical generator. Examples of the generator 170 may include a synchronous generator, an induction generator, an asynchronous generator, a permanent magnet synchronous generator, an AC (Alternating Current) generator, a DC (Direct Current) generator, a synchronous generator with stator coils, or any other device that converts mechanical power to electric power.

Electric power produced by the generator 170 may be provided on an electric bus 190 for distribution to load 195 via power conductors. The electric bus 190 may include any power connector or connectors that conduct high voltage electric power. As used herein, the term "high voltage electric power" refers to voltages above fifty volts. Examples of the electrical bus 190 may include a busbar, a busway, a bus duct, a solid tube, a hollow tube, a wire, an electrical power cable, or any other power conductor. The gas turbine engine 100 may also include other power connector(s) to conduct high voltage electric power. Loads 195 include all systems or devices that consume electric power, and may include motors, pumps, energy storage systems and other electrically power systems and devices in a vehicle or gas turbine engine system.

Power connectors may be used on any conductor or power system. For example, in a hybrid and/or electric vehicle and/or a gas turbine engine 100, power connectors may be used to facilitate construction and maintenance by allowing efficient connection and disconnection of power conductors. Hazardous levels of voltage, such as high voltage electric power, may exist in the power conductors when they are in operation. Before performing maintenance it is important not only to discharge this voltage but to prove that the system is dead before any maintenance or construction personnel are exposed to hazard. This is done through live-dead-live testing using a voltage/current meter to first probe a known live point providing a source of voltage, such as a wall outlet or a battery (to prove the meter is working), to probe the power circuit believed to be off (to prove it is off) and then probe the known live point again (to prove the meter is still working). If the system can only be probed at a connector with pins (as opposed to sockets), this middle step in live-dead-live testing may be unacceptably hazardous. For example, it is possible to short the pins with the meter in the process of testing them, which may produce an arc flash, or other hazard, if the system turns out to be live. To avoid this situation, a power connector spacer system may be used.

Figure 2:
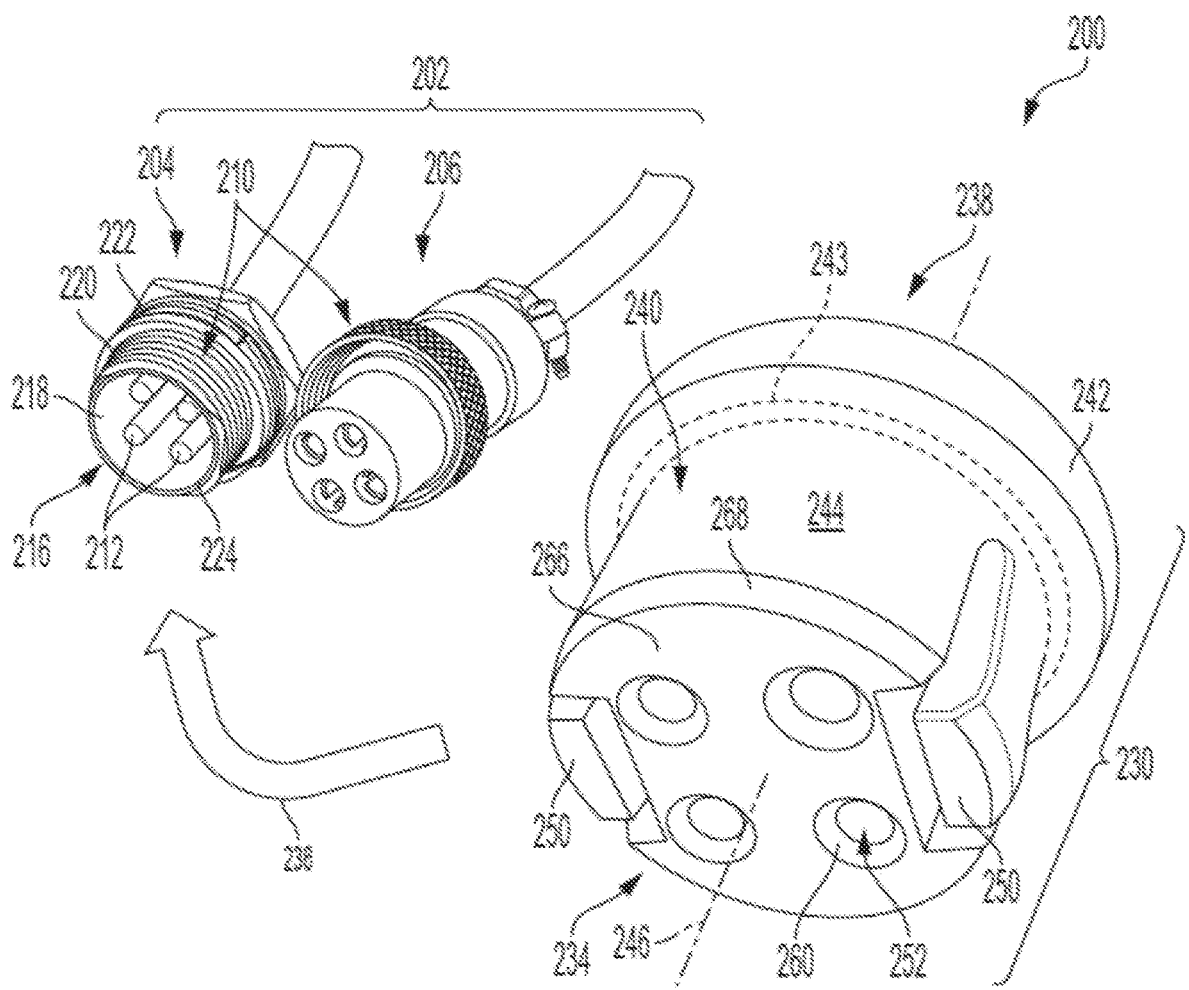
FIG. 2 is a perspective view of an example power connector spacer and a two piece power connector.

FIG. 2 is a perspective view of an example power connector spacer 200 in a power connector spacer system. FIG. 2 also illustrates a pinned power connector 202, which includes a male power connector 204 and a female power connector 206. The male and female power connectors 204 and 206 may be detachably electrically connected with corresponding couplers 210. In the illustrated example, the couplers 210 are threaded corresponding male and female couplers 210. In other examples, twist-lock, snap-fit, or any other form of coupler may be used to create and maintain a disconnectable electrical connection between the conductive male pins and conductive female sockets of the power connector 202. The conductive male pins and female sockets of the power connectors 204 and 206 may each be terminated to power conductors that conduct high voltage electric power.

The male power connector 204 may include power pins 212 positioned in a receptacle 216 included in the male power connector 204. In the illustrated example, four conductive power pins 212 are illustrated. In other examples, additional or fewer power pins 212, such as three power pins 212 for three phase AC power or two power pins 212 for positive and negative DC power may be included. Also, in examples, additional pins, such as a pin used to indicate the male and female power connectors 204 and 206 are coupled together by the couplers 210 may also be included. The receptacle 216 is a cavity defined by a shell formed with an inner surface 218, which may be opposite an outer surface 220 that includes the coupler 210 of the male power connector 204. The power pins 212 may fixedly extend into the receptacle 216 from a base 222 of the male power connector 204. The inner surface 218 may extend between the base 222 and a peripheral external rim 224 of the male power connector 204. The female power connector 206 may include sockets 226 that are conductive. The sockets 226 may surround and electrically connect with the power pins 212 when at least a portion of the female power conductor 206 is inserted past the rim 224 into the receptacle 216 and the couplers 210 are detachably coupled. Once the coupler 210 of the male power connector 204 is detached from the corresponding coupler 210 of the female power connector 206, the power pins 212 may disengage from electrical connections with the sockets 226. The power connector spacer 200 may be used, in place of the female power connector 206 to perform testing and prevent inadvertent shorting of the power pins 212 during voltage measurement in the male power connector 202.

The power connector spacer 200 includes a non-conducting body 230 having proximate end 232 for insertion into the receptacle 216 of the male power connector 204 in place of the corresponding female power connector 206 as illustrated by arrow 236. The non-conducting body 230 may be plastic, ceramic or some other formable material. In example, the power connector spacer 200 may be a 3 dimensional (3D) printed part. A distal end 238 of the body 230 may extend outwardly away from the receptacle 216 of the male power connector 204.

The body 230 may include an insertable portion 240 and a flange 242. In the illustrated example, the insertable portion 240 may have a cylindrically shaped wall 244 having a first diameter, and the flange 242 may have a second diameter larger than the first diameter. Both the insertable portion 240 and the flange 242 are concentric with a central axis 246 of the power connector spacer 200. The cylindrically shaped wall 244 may extend from the proximate end 234 to the flange 242, with the flange extended the remainder of the body 230 to the distal end 238. A transition 243 may be provided between the insertable portion 240 and the flange 242 having a frustoconical shape.

A latch 250 may be included on the insertable portion 240 of the body 230. The latch 250 may be one or more latches 250. The latch(s) 250 may be dimensioned and configured to detachable couple with the interior surface 218 of the receptacle 216 of the male power connector 204. The latch(s) 250 may therefore not interact with or otherwise form a mechanical contact with the coupler 210 of the male power connector 204, and instead may be spaced away from, and not used with the coupler 210. Thus, for example, the coupler 210 may be used only for coupling to the corresponding female power connector 206 and does not have any mechanical interaction with the latch(s) 250. In FIG. 2, two latches 250 are illustrated on opposing sides of the insertable portion 240 as flexible spring tab members formed in the cylindrically shaped wall 244, which may be biased against the interior surface 218 to hold the power connector spacer 200 in the receptacle 216. The flexible spring tab members of this example of the latch 250 are compressively insertable into the receptacle 216 of the male power connector 204 and are biased against the interior surface 216.

The flange 242 may be dimensioned with an outer diameter that is larger than the diameter of the rim 224 of the male power connector 204. Thus, the flange 242 may be dimensioned to abut the rim 224 of the receptacle 216 when the power connector spacer 200 is fully inserted therein. The transition 243 may provide a collar to align the rim 224 concentrically with the flange 242. In examples, the transition 243 may provide a variable diameter for rims of different diameters, such that various different size rims 224 may still coaxially align and abut the flange 242. The flange 242 is formed on the body 230 to limit travel of the body 230 into the receptacle 216 of the male power connector 204 so that each of the power pins 212 are recessed in the passageways 252 toward the distal end 238 of the body 230 and isolated from one another by the non-conducting material of the body 230.

Figure 3:
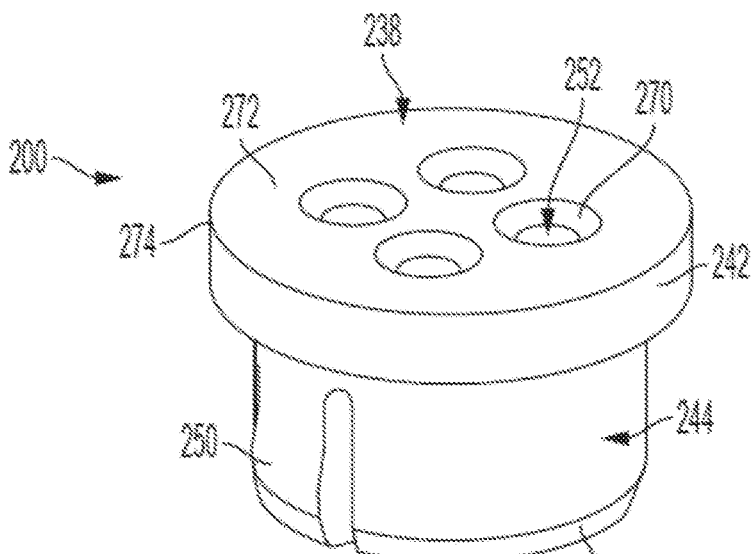
FIG. 3 is a perspective view from a distal end of the example power connector spacer of FIG. 2.

The body 230 may include a plurality of non-conducting passageways 252 extending through the body 230 from the proximate end 234 to the distal end 238. FIG. 3 is a perspective view illustrating the distal end 234 of the power connector spacer 200. With reference to FIGS. 2 and 3, the number of passageways 252 in the body 230 may be the same as the number of power pins 212 included in the male power connector 204. In the example of FIG. 2, four passageways 252 are illustrated. Each of the passageways 252 may be dimensioned to receive, at the proximate end 234 of the body 230 one of the power pins 212 included in the receptacle 216 of the male power connector 204. Once in the passageways 252, each of the power pins 212 may be insulated and isolated from the other power pins 212.

A respective end of each of the power pins 212 may be disposed in the respective passageway 252 away from the distal end 238 of the body 230 in order to isolate detection of high voltage electric power by contact with a meter probe in the respective passageways 252. The passageways 252 formed at the proximate end 234 of the body 230 are formed with a beveled edge 260 (countersink) surrounding the respective passageways 252 in a planar surface 266 forming an end of the cylindrically shaped insertable portion 240. The beveled edge 260 may receive and guide the respective power pins 252 into the passageways 252 upon insertion of the power connector spacer into the receptacle 216. In addition, an outer beveled edge 268 may be formed at the peripheral edge of the planar surface 266 to align and guide insertable portion 244 of the body 230 into the receptacle 216. The passageways 252 at the distal end 238 of the power connector spacer 200 may similarly be surrounded by respective beveled edges 270 to receive and guide the meter probe into the respective passageways 252. The distal end 238 of the power connector spacer 200 may be a planar surface 272 in which the beveled edges 270 and the passageways 252 are disposed. A peripheral outer edge 274 of the planar surface 272 may define the circumference and diameter of the flange 242.

The power conductor spacer 200 may be inserted into the receptacle 216 using, for example insulated gloves, before inserting a meter probe into the passageways 252 at the planar surface 272 during testing. The power conductor spacer 200 may be made of a non-conductive material such as plastic. In some examples, it may not be desirable to have a perfect insulator, where electric charges cannot flow or move at all. Rather, in examples, the power conductor spacer 200 may have a predetermined resistivity that provides a residual conductivity for permitting some amount of electric charge to flow. The residual conductivity may provide a relatively high predetermined resistance shunt to ground via the power conductor spacer 200 with conductivity being low enough that a hazardous discharge does not occur when inserted into an energized male power connector 204. The high resistance shunt to ground may provide dissipation, or bleed off, of charge potential that may be present in the male power connector 204 when the power conductor spacer 200 is inserted. The charge potential may be dissipated to the chassis or other structure in contact with the power conductor spacer 200, or between power pins 212 in the male power conductor 204. Thus, for example, a charge potential on one or more of the power pins 212 may be dissipated to another of the power pins 212 or through another path to ground along a relatively high predetermined resistance path to ground.

Upon insertion, the flange 242 of the power connector spacer 200 may rest on the rim 220 of the male power connector 204 enabling easy insertion/removal by an individual wearing electrical safety gloves. The beveled edges 260 and 270 surrounding the passageways 252, which provide holes for the power pins 212 both on the inside, in planar surface 266 at proximate end 234, and outside, in planar surface 272 at distal end 238, enable non-binding alignment and insertion into the male power connector 204 at the proximate end 234, and non-binding meter probe alignment and insertion at the distal end 238. In addition, since the power pins 212 only extend partially through the passageways 252, the meter probe(s) may be inserted into the passageways 252 to cause rigid and solid contact with the power pins 212. Thus an operator of the meter probe can confirm tactile contact, thereby ensuring and providing confidence to the operator that any voltage present on the power pins 212 has been accurately measured. In addition, the walls of the passageways 252 may contain and control the meter probe to avoid inadvertent contact with a conductive object such as another power pin or a meter probe. Further operator assistance is provided by the latch(s) 250, which maintains having spring tabs on the side of the insert to hold and maintain the relative position of the male power connector 204 and the power connector spacer while the operator operates the meter probe(s) to perform testing.

Figure 4:
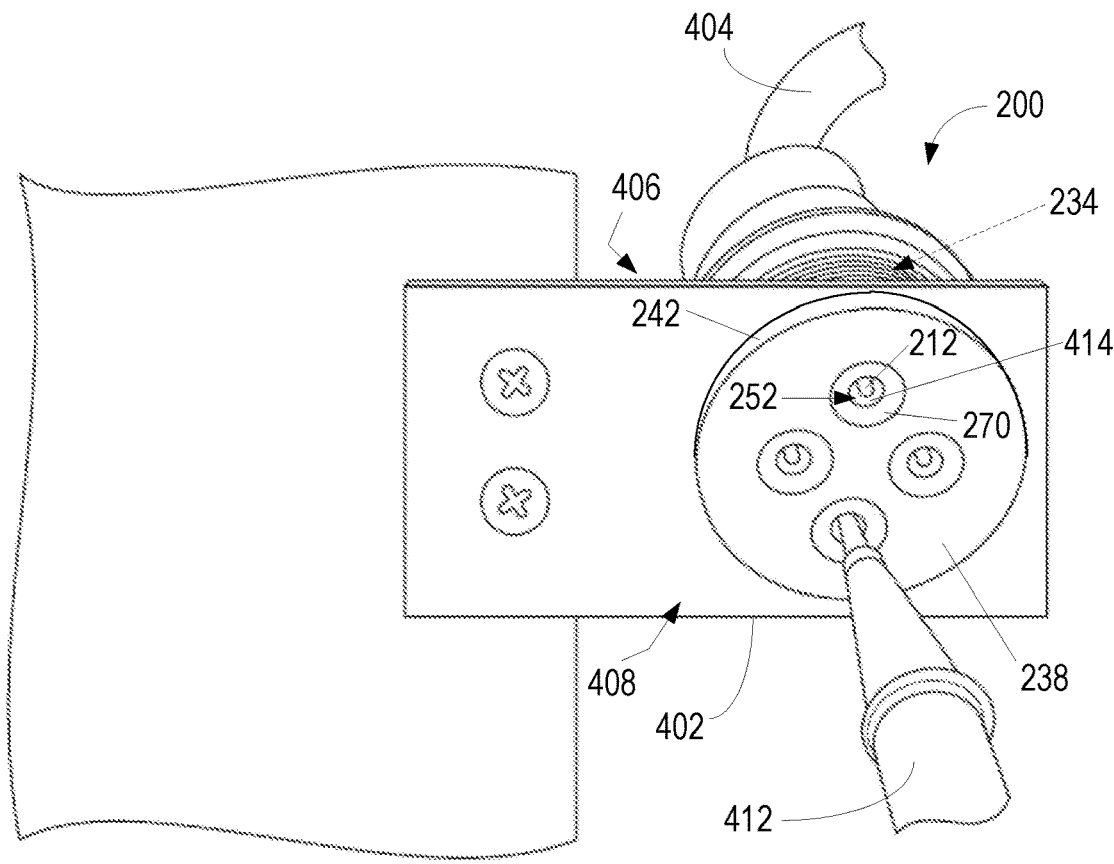
FIG. 4 illustrates example mounting and use of the example power connector spacer of FIGS. 2 and 3.

FIG. 4 illustrates example mounting and use of the example power connector spacer 200 of FIGS. 2 and 3. In FIG. 4, the power connector spacer 200 is illustrated as mounted in a bracket 402 and the proximate end 234 is inserted into a male power connector 204 that is electrically connected with a power conductor 404. The bracket 402 may be any rigid material or configuration that allows fixed mounting such that both the proximate end 234 and the distal end 238 are fully accessible. In other examples, the bracket 402 may be any other configuration, may be part of an existing structure, or may be omitted and the power connector spacer 200 may be stored with the meter probe, with the male power connector 204 or any other location. Referring to FIGS. 2-4, in the illustrated configuration, the flange 242 is formed on the body 230 to abut the mounting bracket 402 on which the power connector spacer 200 is mounted such that the insertable portion 240 of the body 230 is on a first side 406 of the bracket 402, and the flange 242 is on a second side 408 of the bracket 402. Thus, in this example, the travel of the body 230 into the receptacle 216 is limited by the bracket 402 abutting the rim 224 of the male power connector 204.

In examples, the power connector spacer 200 may be part of a vehicle permanently attached near the male power connector 204 so the male power connector 204 could be disconnected from the female connector 206, and inserted into the power connector spacer 200 in a fixed bracket 402 for testing with fewer hands required. In the illustrated example, the bracket 402 is fixedly coupled by fasteners with other structure, such as part of a vehicle. In other examples, the bracket 402 may be carried by operator/maintainer and installed on a structural feature with a hook or a magnet before disconnecting any power connectors. This would allow the power connector spacer 200 to be removed from the vehicle, such as before flight of an aircraft, to avoid adding weight. Such a relocatable and temporarily fixed bracket 402 may be labeled and tracked or otherwise accounted, such as by bright colors, flags, RFID signaling, logging, checklists, or other notice providing feature to avoid leaving it on the vehicle during operation of the vehicle.

As best illustrated in FIG. 4, the power pins 212 extend only partially through the passageways 242 such that a meter probe 412 is inserted into the passageway 242 in order to make contact with a respective power pin 212 therein. This provides alignment of the meter probe 412 by the walls 414 of the passageway 252 to ensure positive tactile confirmation of electrical contact between the meter probe 412 and the power pin 212. In addition, the walls 414 may operate as a guide and protective sleeve to not only maintain the meter probe 412 in a respective passageway 252, but also surround the meter probe 412 with non-conductive material to avoid inadvertent contact with any conductive item other than the power pin 212 disposed in the passageway 252. Entry into the passageway 252 of the meter probe 412 may be facilitated by alignment using the beveled surface 270. Since the meter probe 412 is inserted into the passageway 252 and surround by the walls 414, slippage off the power pin 212, or contact with another meter probe 412, another power pin 212, or any other conducting material is unlikely. In other examples, different types/styles of meter probes 412 may be used and the depth, size, configuration and/or other parameters of the passageway 252, walls 414 and/or beveled surface 270 may be adjusted accordingly. The meter probe 412 provides a voltage indication on a user interface, which may be on the meter probe 412 or on a meter that is in communication with the meter probe 412 by a probe lead, or wirelessly.

Figure 5:
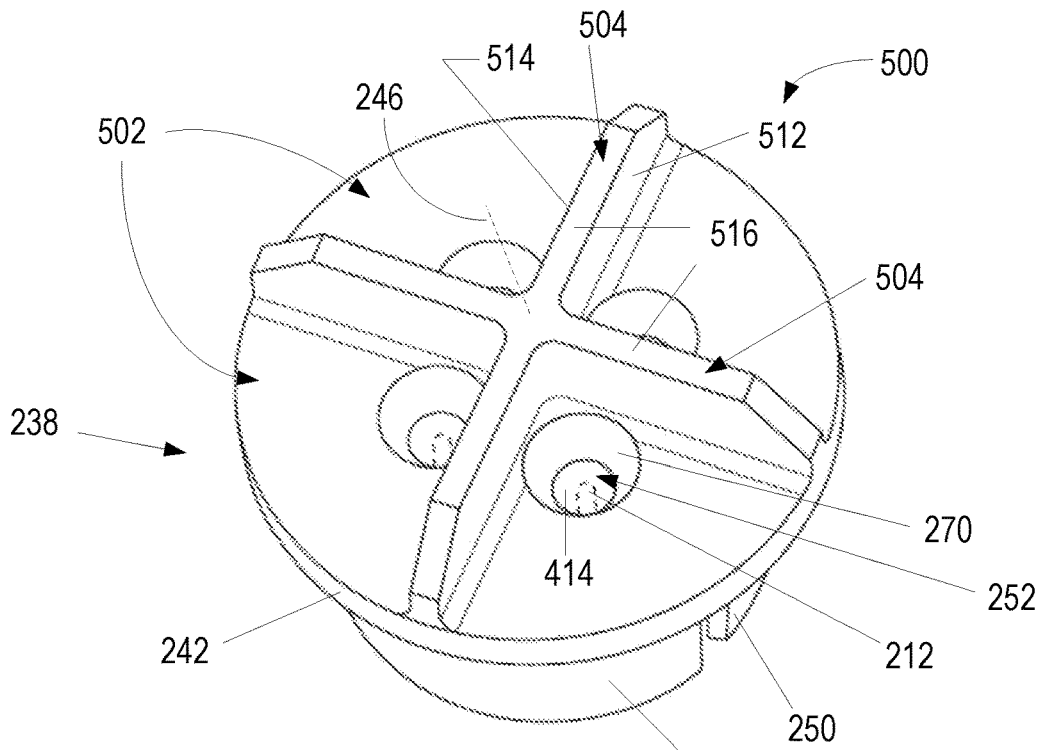
FIG. 5 is a perspective view from a distal end of an example power connector spacer.

FIG. 5 is a perspective view from a distal end of an example power connector spacer 500. The power connector spacer 500 may include a body having an insertable portion 240, a flange 242, passageways 252 having walls 414 and other features and functionality described herein. Accordingly, for purposes of brevity such features and functionality will not be fully repeated and such features and functionality as described with reference to FIGS. 1-4 are fully applicable and interchangeable in the example of FIG. 5 unless otherwise noted. In this example, planar surfaces 502 at the distal end 238 are separated by walls 504.

The walls 504 may be formed on the body 230 between the passageways 252. The walls 504 may extend away from the body 230 to provide additional isolation barriers for the meter probe between the power pins 212. In the illustrated example, the walls 540 intersect at the central axis 246 and extend radially outwardly to a peripheral edge formed by the flange 242. The walls 540 include opposing surfaces 510 and 512 extending away from the planar surface 502 to a ledge 516 positioned above the planar surface 502. The walls 504 between the passageways 252 further prevent electrical connections between the power pins 212 or other conductive material during testing.

Figure 6:
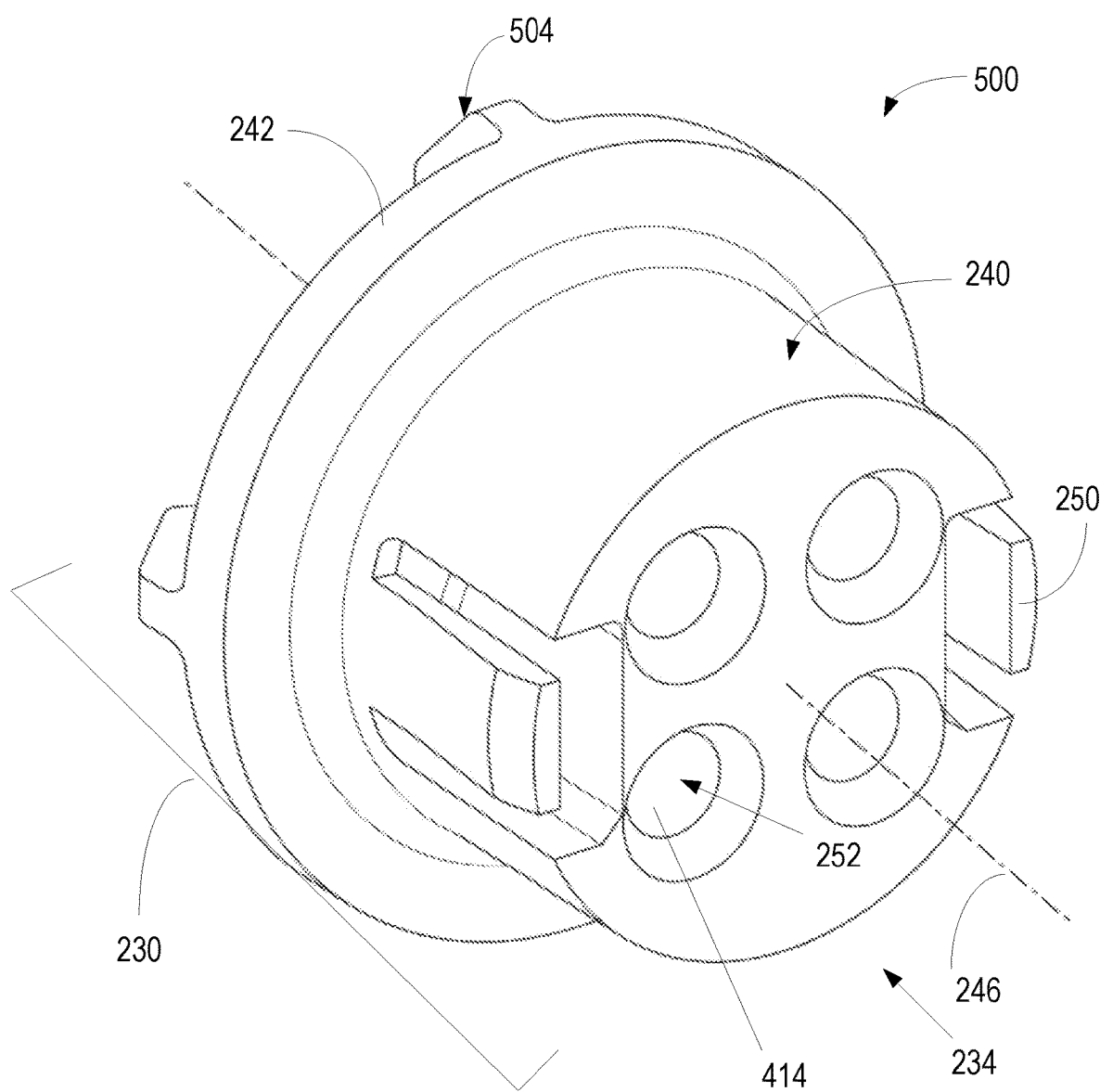
FIG. 6 is a perspective view from a proximate end of the example power connector spacer of FIG. 5.

FIG. 6 is a perspective view from a proximate end of the example power connector spacer of FIG. 5. In FIG. 6, the walls 504 are illustrated as extending in the opposite direction from the insertable portion 240 of the body 230. FIG. 6 further illustrates some of the previously discussed features and functionality, which, for purposes of brevity will not be repeated.

Referring to FIGS. 1-6, the power connector spacer must be appropriate for the specific connector being tested. In many cases this may mean 3-d printing a specific spacer for each connector type/size to be tested. A vehicle set containing all potentially required connectors can be included with the electrical safety equipment required for maintaining a vehicle. In an example, an insert may be three dimensional (3-D) printed to allow safe measurement of a MIL-STD 5015 connector, such as a 36-5 insert to match different sizes/families of high voltage/power DC connections.

The power connector spacer system enables the selection of which side of a connection will be pins (such as a male connector), and which side will be sockets (such as a female connector) to have less of an impact on the safety and maintenance operations. Instead, other factors, such as spare strategy, safety and/or interchangeability may be factors in this engineering and design choice. This additional design flexibility may have particular impact on a hybrid electric system where there may be multiple sources of electricity on a system (batteries & an engine) and the direction of power flow (hence which side should have the socket) is not fixed. The power connector system has application not only for aircraft, but also for applications in automobile or other systems utilizing high voltage/power connectors.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed. Unless otherwise indicated or the context suggests otherwise, as used herein, "a" or "an" means "at least one" or "one or more."

While various embodiments have been described, it will be apparent to those of ordinary skill in the art that many more embodiments and implementations are possible.

Accordingly, the embodiments described herein are examples, not the only possible embodiments and implementations.

What is claimed is:

1. A power connector spacer comprising:
a non-conducting body having proximate end for insertion into a receptacle of a male power connector in place of a corresponding female power connector, and a distal end extending outwardly away from the receptacle of the male power connector;
a latch included on an insertable portion of the body, the insertable portion including the proximate end, and the latch being dimensioned and configured to detachable couple with an interior surface of the receptacle of the male power connector away from a coupler included on the male power connector used for coupling to the corresponding female power connector;
a flange included on the body, the flange dimensioned to abut a rim of the receptacle;
and the body include a plurality of non-conducting passageways extending through the body from the proximate end to the distal end, each of the passageways dimensioned to receive, at the proximate end of the body, and isolate, one of a plurality of power pins included in the receptacle of the male power connector, and a respective end of each of the power pins being disposed in respective passageways away from the distal end of the body for isolated detection of high voltage electric power by contact with a meter probe in the respective passageways.

2. The power connector spacer of claim 1, wherein each of the passageways includes only a single pin, and are formed by walls that isolate and insulate the meter probe from contact with any electrically conductive item other than the single power pin.

3. The power connector spacer of claim 1, wherein the passageways at the proximate end of the body are formed with a beveled edge to receive the respective power pins.

4. The power connector spacer of claim 1, wherein the latch is a plurality of spring tab members that are compressively insertable into the receptacle of the male power connector and are biased against the interior surface.

5. The power connector spacer of claim 1, wherein the flange is formed on the body to limit travel of the body into the receptacle of the male power connector so that each of the power pins are recessed in the passageways toward the distal end of the body and isolated from one another by the non-conducting material of the body.

6. The power connector spacer of claim 1, wherein the flange is formed on the body to abut a mounting bracket on which the power connector spacer is mounted such that the insertable portion of the body is on a first side of the bracket, and the flange is on a second side of the bracket.

7. The power connector spacer of claim 1, wherein the distal end of the body includes walls formed on the body between the passageways, the walls extending away from the body to provide additional isolation barriers for the meter probe between the power pins.

8. The power connector spacer of claim 1, wherein the power connector spacer is formed of non-conductive material having a residual conductivity to provide a relatively high predetermined resistance shunt to ground.

9. The power connector spacer of claim 1, where the power pins are at least 18 gauge and the high voltage electric power is at least 50 volts.

10. A method of testing for an energized power circuit comprising:
detaching a coupler of a male power connector from corresponding coupler of a corresponding female power connector;
withdrawing the female power connector from a receptacle of the male power connector to expose a plurality of power pins fixedly extending into the receptacle from a base of the male power connector;
inserting a non-conducting power connector spacer in the receptacle of the male power connector in place of the corresponding female power connector by:
aligning a plurality of passageways formed in the power connector spacer with respective power pins extending from the base of the male power connector;
inserting an insertable portion of a body of the power connector spacer into the receptacle of the male power connector such that each of the respective power pins enters a proximate end of power connector spacer and extends through only a portion of a respective one of the passageways;
engaging a latch included on the body of the power connector spacer with an interior surface of the receptacle that is other than the coupler such that the proximate end of the body is adjacent the base; and
inserting a meter probe into each of the passageways at a distal end of the power connector spacer to electrically contact and measure a voltage of each of the respective power pins residing in the passageways.

11. The method of claim 10, further comprising aligning the respective power pins at a respective entry to the passageways with respective beveled surfaces formed in the body to surround each of the passageways.

12. The method of claim 10, further comprising contacting the power pins with the body to create a relatively high predetermined resistance path to ground; and dissipating power from the power pins with the relatively high predetermined resistance path to ground due to residual conductivity of the body.

13. The method of claim 10, wherein inserting the insertable portion of the body of the power connector spacer into the receptacle of the male power connector comprises abutting a peripheral edge of the receptacle forming a rim of the male power connector against a flange included on the body of the power connector spacer.

14. The method of claim 13, further comprising inserting the power connector spacer into a bracket such that the insertable portion of the body of the power connector spacer is position on a first side of the bracket and the flange is positioned on a second side of the bracket, the first side opposite the second side.

15. The method of claim 10, wherein only one power pin is disposed in each of the passageways, and inserting the meter probe into each of the passageways comprises guiding, by the wall defining the passageway, the meter probe into contact with the only one power pin such that the meter probe is isolated from any conductive material, other than the only one power pin.

* * * * *